United States Patent [19]

Dietz

[11] 4,001,607
[45] Jan. 4, 1977

[54] DRIVE CIRCUIT FOR A GATE SEMICONDUCTOR DEVICE

[75] Inventor: Wolfgang Friedrich Wilhelm Dietz, New Hope, Pa.

[73] Assignee: RCA Corporation, New York, N.Y.

[22] Filed: June 9, 1975

[21] Appl. No.: 585,209

[52] U.S. Cl. .......................... 307/252 C; 315/364; 315/408
[51] Int. Cl.² ................... H03K 17/72; H01J 29/76
[58] Field of Search ....... 307/252 C, 252 J, 252 M; 323/225 C; 315/340, 29, 27 R, 28

[56] References Cited
UNITED STATES PATENTS

| | | | |
|---|---|---|---|
| 3,300,680 | 1/1967 | Saudinaitis | 307/252 C |
| 3,459,972 | 8/1969 | Harris | 307/252 J |
| 3,821,565 | 6/1974 | Horinaga | 307/252 C |
| 3,912,945 | 10/1975 | Nakagawa | 307/252 C |

Primary Examiner—John Zazworsky
Attorney, Agent, or Firm—Eugene M. Whitacre; Paul J. Rasmussen

[57] ABSTRACT

A drive circuit for a gated semiconductor device includes a switching device which provides first and second conduction states. The switching device is coupled to a source of direct current potential by means of a first inductor and coupled to the gate of the gated semiconductor device by means of a capacitor. A second inductor is coupled to the gate of the gated semiconductor device. Negative current is produced in the gate of the gated semiconductor device and energy is stored in first and second inductors during the first conduction state of the switching device. Positive current is produced in the gate of the gated semiconductor device during the second conduction state. The first and second inductors provide for enhancement of the positive gate current and also charging of the capacitor during the second conduction state.

3 Claims, 6 Drawing Figures

DRIVE CIRCUIT FOR A GATE SEMICONDUCTOR DEVICE

This invention relates to a drive circuit for controlling the conduction of a semiconductor device.

In many circuit applications it is desirable to change the conduction state of active current conducting devices quickly, particularly when the devices are utilized as switches. Fast switching becomes more of a task as the amount of switch current and voltage increases to several amperes and several hundred volts. Such switching conditions are present in relatively high switching rate circuits such as horizontal deflection circuits of television receivers. Suitable horizontal rate switching can be achieved by utilizing transistors or silicon controlled rectifiers as the switching elements.

A relatively new switching device called a gate-turn-off silicon controlled rectifier (hereinafter referred to as a GTO) is also suitable for a rapid switching of high voltages and currents such as occur in horizontal deflection circuits. Gate-turn-off silicon controlled rectifiers (GTOs) employ the same basic four-layer, three-junction, regenerative semiconductor structure and exhibit a pulse turn-on capability similar to that of conventional silicon controlled rectifier (SCRs). The GTO devices, however, differ from conventional SCRs in that they are designed to turn off with the application of a negative voltage to the gate electrode. It is not necessary to reduce the anode voltage to effect turn-off of a GTO, as is required for conventional SCRs.

The GTO also offers significant advantages in switching performance over power transistors. The most significant of these advantages is the high blocking voltage and high switching current characteristics of the GTO with small-size semiconductor pellets. However, although transistors can provide low on-state voltages [$V_{CE}(SAT)$] for moderate current levels (i.e., in the order of 5 to 10 amperes), they are quickly driven into quasi-saturation at currents beyond a specified maximum value. In contrast, comparable medium-current GTOs can maintain low on-state voltage ($V_T$) over a much wider current range (e.g., for 2 to 50 amperes). It is desirable to provide a drive circuit which is capable of effecting relatively fast switching of a device such as a power transistor or GTO by supplying suitable switching signals to the base or gate electrode of the particular device.

SUMMARY OF THE INVENTION

A drive circuit for a gated semiconductor device includes a source of direct current potential, switching means for providing first and second conduction states and a gated semiconductor device. Capacitance means, coupled to the switching means and a gate electrode of the gated semiconductor, provides a first gate current in response to the first conduction state. A first inductance means, coupled to the source of direct current potential and the switching means, stores energy during the first conduction state to be utilized to enhance a second gate current and the replenishment of energy in the capacitance means during the second conduction state. Means including a second inductance, coupled to the gate electrode and the first inductance means, stores energy during said first conduction state to be utilized to further enhance the second gate current during the second conduction state.

A more complete description of the invention is given in the following description and accompanying drawings of which:

FIGS. 1, 2 and 3 are circuit diagrams of drive circuits embodying the invention; and FIGS. 4, 5 and 6 are normalized waveforms illustrating voltage and current at various points in the circuits of FIGS. 1, 2 and 3, respectively.

DESCRIPTION OF PREFERRED EMBODIMENTS OF THE INVENTION

Figure 1:
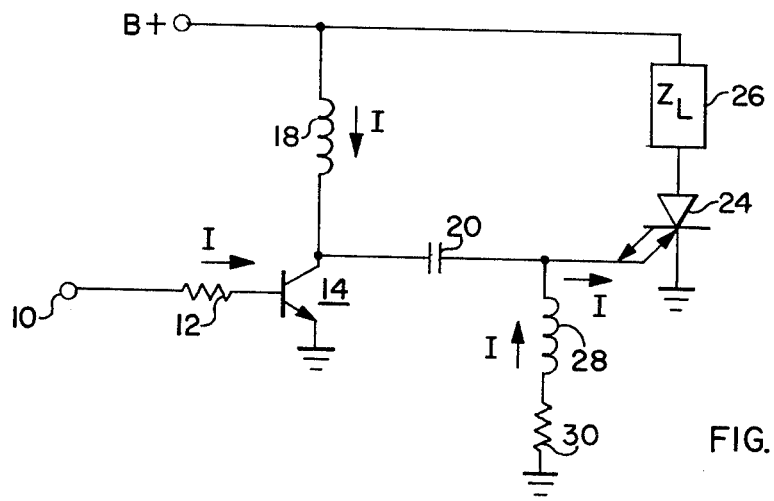
Figure 4:
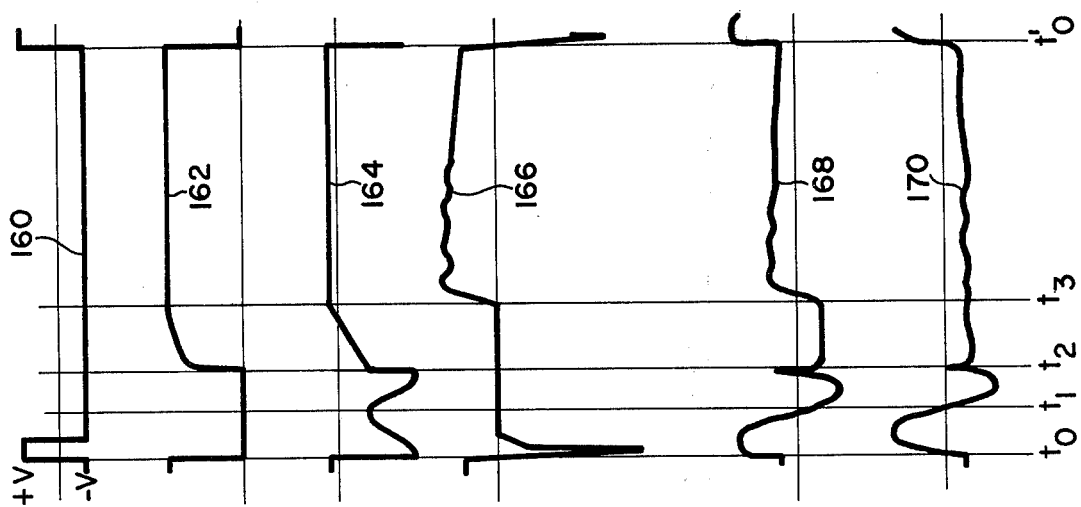

In FIG. 1, a source of drive signals (not shown) provides a drive signal at a terminal 10 as shown in waveform 32 of FIG. 4. Terminal 10 is coupled through a resistor 12 to the base of a transistor 14. The collector electrode of transistor 14 is coupled through an inductor 18 to a source of direct current potential (B+). The emitter electrode of transistor 14 is coupled to reference potential. The collector electrode of transistor 14 is also coupled through a capacitor 20 to the gate electrode of a GTO device 24. The cathode electrode of GTO 24 is coupled to reference potential and the anode electrode is coupled through a load impedance 26 to B+. Although the load impedance 26 is illustrated as being serially coupled, it is to be understood that it may also be coupled in parallel with GTO 24, which acts as a switch for current through load impedance 26. The gate electrode of GTO 24 is also coupled through a series combination of an inductor 28 and a resistor 30 to a reference potential.

In operation all positive currents are in the direction of the arrow. Just prior to $T_0$ the capacitor 20 is charged to a voltage approximately equal to B+. At $T_0$ the signal at terminal 10, waveform 32, makes a transition from a −V to a +V, producing a positive current through resistor 12 and the base-emitter junction of transistor 14. The base-emitter current flow in the transistor 14 forward biases the base-emitter junction and produces saturation of transistor 14 as shown in voltage waveform 34 of FIG. 4 at $T_0$. Saturation of transistor 14 initiates a current flow, waveform 42 of FIG. 4, from B+ through inductor 18 to reference potential.

Saturation of transistor 14 also provides a low impedance path for the discharge of capacitor 20 which produces a negative voltage at the gate electrode during the interval $T_0 - T_1$, as shown in waveform 36 of FIG. 4. The negative voltage at the gate electrode produces a negative current as shown in waveform 38 of FIG. 4 at $T_0$. Discharge of capacitor 20 also produces an increase in positive current flow through the resistor 30 and inductor 28 as shown in waveform 40 of FIG. 4.

The negative current in the gate electrode of GTO 24 provides for turn-off of the GTO 24. As the GTO 24 turns off, the negative gate current is reduced in magnitude until the GTO is completely turned off, at which time the gate current is approximately zero because of the high gate to cathode impedance of GTO 24 in the non-conduction state.

At $T_1$ the voltage at terminal 10 as shown in waveform 32 makes a transition from +V to −V, thereby reverse biasing the base-emitter junction of transistor 14 which provides for cut-off of transistor 14. With transistor 14 in cut-off, the voltage at the collector electrode increases as shown in waveform 34, thereby increasing the voltage at the gate electrode of GTO 24 as shown in waveform 36 and producing a positive gate current as shown in waveform 38. The current in inductor 28 which is produced by the discharge of capacitor 20 during the interval $T_0 - T_1$ enhances the positive gate current into the GTO 24 during the interval $T_1 - T_0'$. The positive gate current into the GTO 24 enables GTO 24 for conduction from B+ through the load impedance 26 and GTO 24 to reference potential when the anode of GTO 24 is positive.

Figure 2:
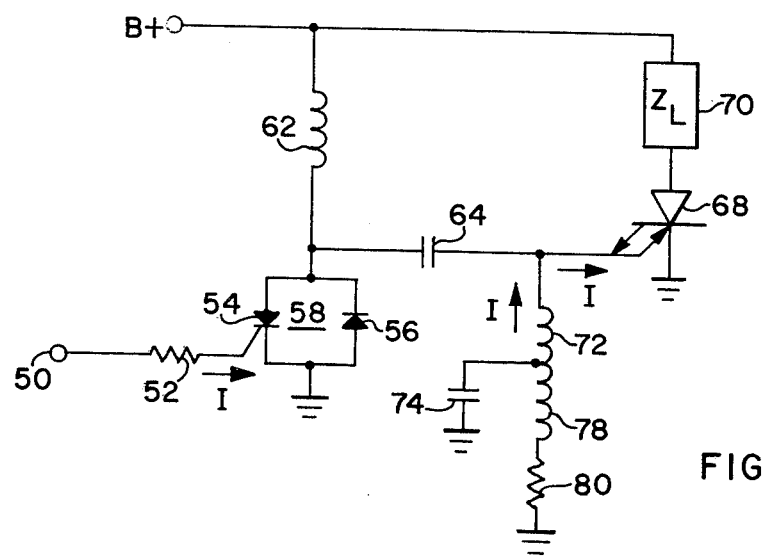
Figure 5:
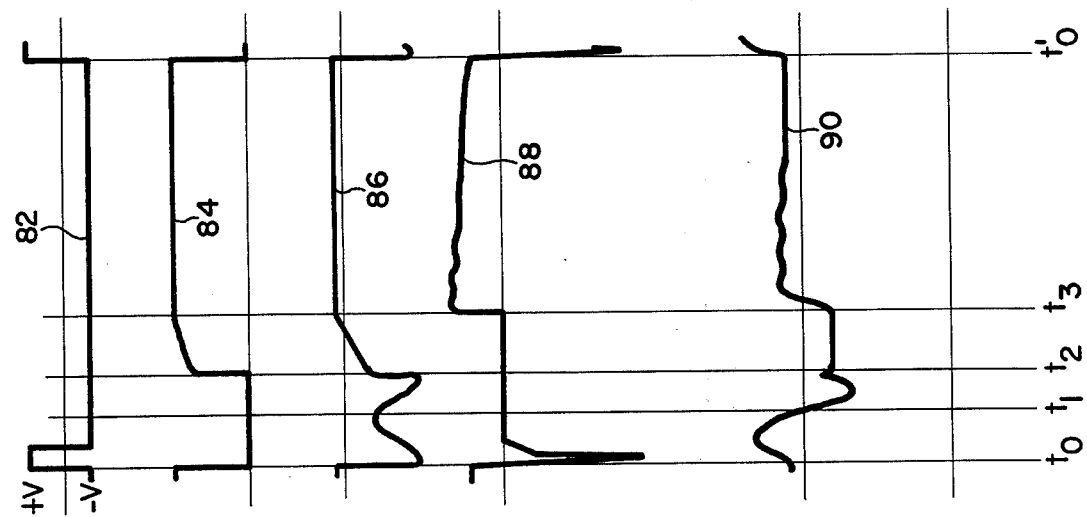

In FIG. 2 a source of drive signals (not shown) provides a drive signal at a terminal 50 as shown in waveform 82 of FIG. 5. Terminal 50 is coupled through a resistor 52 to the gate electrode of an SCR 54 operating in conjunction with an oppositely poled damper diode 56 to form a drive switch 58. The anode of SCR 54 is coupled through an inductor 62 to B+. The cathode of SCR 54 is coupled to reference potential. The anode of SCR 54 is also coupled by means of a capacitor 64 to the gate electrode of a GTO 68. The anode electrode of GTO 68 is coupled through a load impedance 70 to B+. The cathode of GTO 68 is coupled to reference potential. The gate electrode of GTO 68 is coupled through a series combination of an inductor 72 and a capacitor 74 to reference potential. Capacitor 64, inductor 72 and capacitor 74 form a commutation network 76 which forms a resonant circuit which provides for turn-off of the drive switch 58 at $T_1$ as shown in FIG. 5. The commutation network 76 was not required in FIG. 1 since the transistor is turned off simply by turning off the base drive current. The junction of inductor 72 and capacitor 74 is coupled through a series combination of an inductor 78, which is magnetically coupled to inductor 72, and a resistor 80 to reference potential.

In operation, just prior to $T_0$, capacitor 64 is charged to approximately B+. At $T_0$ the signal at terminal 50, waveform 82, makes a transition from $-V$ to $+V$ which produces a positive current through the resistor 52 and the gate-cathode junction of SCR 54. The positive current through the gate-cathode junction of SCR 54 initiates conduction of the SCR 54 producing a transition from approximately B+ to 0 volts at the anode of SCR 54 as shown in waveform 84 of FIG. 5. The conduction of SCR 54 initiates a current flow from B+ through inductor 62 and SCR 54 to reference potential. Conduction of SCR 54 at $T_0$ also produces a negative voltage as shown in waveform 86 of FIG. 5 at the gate electrode of GTO 68 because of the charge on capacitor 64. The negative voltage at the gate electrode produces a negative current through the gate electrode at $T_0$ as shown in waveform 88 of FIG. 5.

The conduction of SCR 54 also provides for the discharge of capacitor 64 through capacitor 74 and inductor 72 and through resistor 80 and inductors 78 and 72. The current through inductor 72 is shown in waveform 90 of FIG. 5.

During the interval $T_0 - T_1$ as the GTO 68 turns off, the negative gate current as shown in waveform 88 of FIG. 5 decreases until GTO 68 turns off, at wich time the gate current is 0. At $T_1$ the current through inductor 72 as shown in waveform 90 reverses polarity producing a commutating current through capacitor 74, diode 56 and capacitor 64.

At $T_2$ the drive switch 58 ceases conduction and the voltage at the anode of SCR 54 increases as shown in waveform 84 of FIG. 5. The voltage at the gate electrode of GTO 68 also increases at $T_2$ as shown in waveform 86 of FIG. 5. Due to the negative voltage on the capacitor 74 at $T_2$, the voltage at the gate electrode of GTO 68 does not reach a level which forward biases the gate-cathode junction of GTO 68 until $T_3$.

At $T_3$ positive gate current starts to flow as shown in waveform 88 of FIG. 5 as a result of the current fow through capacitor 64 and inductors 72 and 78, thus enabling GTO 68 for conduction which produces a current flow from B+ through the load impedance 70 and the GTO 68 to reference potential when the anode of GTO 68 becomes positive.

Figure 3:
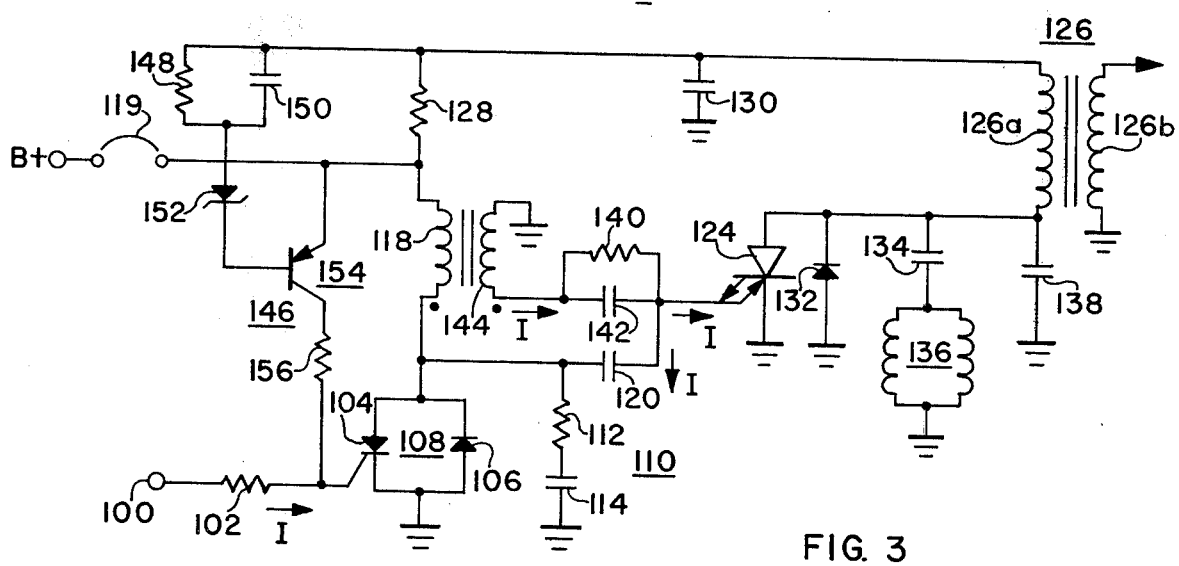
Figure 6:
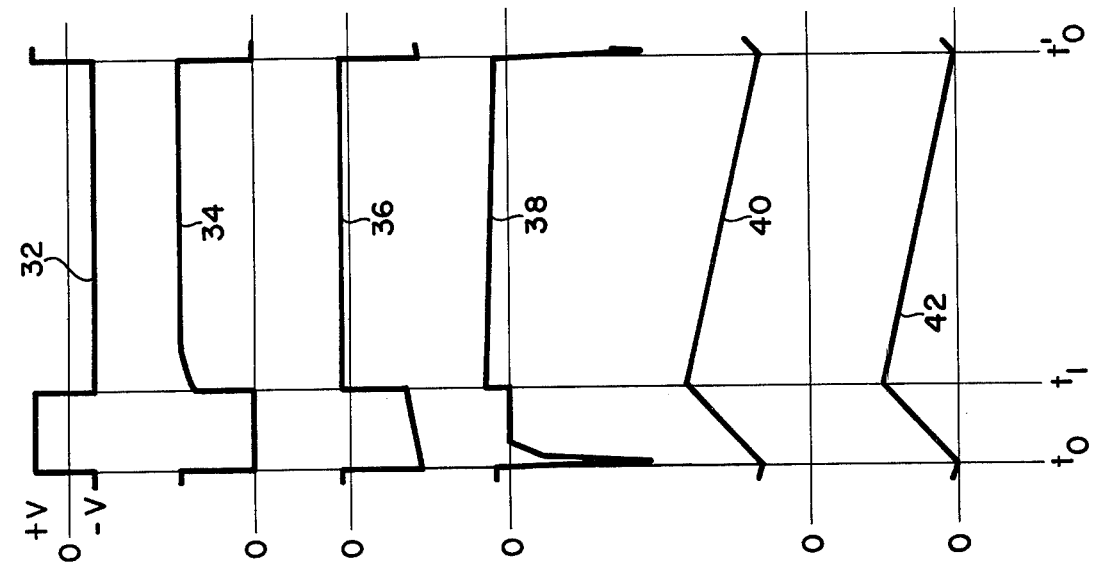

In FIG. 3, a source of drive signals (not shown) provides a drive signal at terminal 100 as shown in waveform 160 of FIG. 6. Terminal 100 is coupled through a resistor 102 to the gate electrode of an SCR 104 operating in conjunction with an oppositely poled dampler diode 106 to form a drive switch 108. A damping network 110 comprising a resistor 112 and a capacitor 114 in series combination is coupled in parallel with drive switch 108. The anode of SCR 104 is coupled through an inductor 118 and a circuit breaker 119 to B+. The cathode of SCR 104 is coupled to reference potential. The anode of SCR 104 is also coupled by means of a capacitor 120 to the gate electrode of GTO 124. The anode electrode of GTO 124 is coupled through a series combination of a primary winding 126a of flyback transformer 126 and a resistor 128 to the circuit breaker 119. The junction of windings 126a and resistor 128 is coupled through a bypass capacitor 130 to reference potential. A damper diode 132 is coupled in anti-parallel combination with GTO 124. A series combination of an S-shaping capacitor 134 and a set of yoke windings 136 is coupled between the anode electrode of GTO 124 and reference potential. A retrace capacitor 138 is also coupled between the anode electrode of GTO 124 and reference potential.

A secondary winding 126b of flyback transformer 126 is coupled to a high voltage rectifier (not shown) to produce an ultor voltage for use with a kinescope tube (not shown).

The gate electrode of GTO 124 is also coupled through a parallel network comprising a resistor 140 and a capacitor 142 in series combination with an inductor 144 to reference potential. The inductor 144 is magnetically coupled to the inductor 118, and the polarization between inductor 118 and inductor 144 is as shown by the polarizing dots shown adjacent the inductors.

Protective network 146 insures that the circuit breaker 119 will open when the current flow through resistor 128 exceeds a predetermined level. Protective network 146 includes a resistor 148, a capacitor 150, a zener diode 152, a transistor 154 and a resistor 156. The parallel combination of the resistor 148 and the capacitor 150 in series with the zener diode 152 is coupled between the junction of resistor 128 and capacitor 130 and the base electrode of transistor 154. The emitter electrode of transistor 154 is coupled to the circuit breaker 119 and the collector electrode is coupled through resistor 156 to the gate electrode of SCR 104.

In operation, just prior to $T_0$, capacitor 120 is charged to approximately B+. At $T_0$ the signal at terminal 100, waveform 160 of FIG. 6, makes a transition from $-V$ to $+V$ which produces a psotive current through the resistor 102 and the gate-cathode junction of SCR 104. The positive current through the gate-cathode junction of SCR 104 initiates conduction of SCR 104 producing a transition from approximately B+ to 0 volts at the anode electrode as shown in waveform 162 of FIG. 6. Conduction of SCR 104 initiates a current flow from B+ through inductor 118 and SCR 104 to reference potential. Conduction of SCR 104 at $T_0$ also produces a negative voltage as shown in waveform 164 of FIG. 6 at the gate electrode of GTO 124 because of the charge on capacitor 120. The negative voltage at the gate electrode of GTO 124 produces a negative current through the gate electrode of GTO 124 at $T_0$ as shown in waveform 166 of FIG. 6.

Conduction of SCR 104 also provides for the discharge of capacitor 120 through inductor 144 and the parallel combination of resistor 140 and capacitor 142, which elements form a resonant circuit. The current through capacitor 120 is shown in waveform 170 of FIG 6 and the current through inductor 144 is shown in waveform 168 of FIG. 6.

During the interval $T_0 - T_1$, as the GTO 124 turns off, the negative gate current as shown in waveform 166 of FIG. 6 decreases until GTO 124 turns off, at which time the gate current is approximately zero. At $T_1$ the current through inductor 144 as shown in waveform 168 reverses polarity, producing a commutating current through capacitor 120 and the parallel combination of resistor 140 and capacitor 142.

At $T_2$ the drive switch 108 ceases conduction and the voltage at the anode of SCR 104 increases as shown in waveform 162 of FIG. 6. The voltage at the gate electrode of GTO 124 also increases at $T_2$ as shown in waveform 164 of FIG. 6. Due to the current flow through inductor 118 the voltage at the gate electrode of GTO 124 does not reach a level which forward biases the gate-cathode junction of GTO 124 until $T_3$.

At $T_3$ positive gate current starts to flow as shown in waveform 166 of FIG. 6 as a result of the current flow through capacitor 120 and inductor 144. The current flow through the gate electrode of GTO 124 enables GTO 124 for conduction which produces a current flow from B+ through circuit breaker 119, resistor 128, winding 126a and GTO 124 to reference potential when the anode of GTO 124 becomes positive with respect to the cathode of GTO 124.

The GTO 124, damper diode 132, S-shaping capacitor 134, yoke winding 136, retrace capacitor 138 and flyback transformer 126 operate in a conventional manner, the only difference being that a GTO is used to perform the function of a transistor.

If a malfunction occurs in the drive circuit which increases the current flow through the resistor 128 to an abnormally high value, the voltage drop across resistor 128 exceeds the zener voltage of zener diode 152 and the forward drop of the base-emitter junction of transistor 154, thereby producing base-emitter current in the transistor 154. The base-emitter current in transistor 154 provides for current flow from B+ through circuit breaker 119, the collector-emitter junction of transistor 154, resistor 156 and the gate-cathode junction of SCR 104. The gate-cathode current in SCR 104 produced by conduction of transistor 154 overrides the current produced by the source of drive signals coupled to terminal 100 thereby producing continuous gating of SCR 104 which results in excessive current flow from B+ through circuit breaker 119, inductor 118 and SCR 104 to reference potential thereby causing circuit breaker 119 to open.

Each of the drive circuits shown in FIGS. 1–3 provide for improved turn-on gating of the GTO. The drive circuits of FIGS. 2 and 3 also provide improved turn-off gating of the GTO due to the efficient switching of SCRs 54 and 104. This improved gating insures more reliable operation of the GTO.

What is claimed is:

1. A drive circuit for a gated semiconductor device, comprising:
   a source of direct current potential;
   switching means for providing first and second conduction states;
   a gated semiconductor device;
   first capacitance means coupled to said switching means and a gate electrode of said gated semiconductor device for providing a first gate current in response to said first conduction state;
   a first inductance means coupled to said source of direct current potential and said switching means for storing energy during said first conduction state to be utilized to enhance a second gate current and the replenishment of energy in said first capacitance means during said second conduction state;
   means including a second inductance coupled to said gate electrode and reference potential for storing energy during said first conduction state to be utilized to further enhance said second gate current during said second conduction state; and
   second capacitance means coupled to said second inductance and to reference potential and forming a resonant circuit with said second inductance and said first capacitance means for commutating said switching means to switch from said first conduction state to said second conduction state.

2. A drive circuit for a gated semiconductor according to claim 1 wherein said gated semiconductor device is a gate-turn-off silicon controlled rectifier.

3. A drive circuit for a gated semiconductor according to claim 2 wherein said means including a second inductance further includes a resistor, said resistor being appropriately sized to optimize said second gate current during said second conduction state.

* * * * *